United States Patent
Li et al.

(10) Patent No.: US 10,859,628 B2
(45) Date of Patent: Dec. 8, 2020

(54) POWER DROOP MEASUREMENTS USING ANALOG-TO-DIGITAL CONVERTER DURING TESTING

(71) Applicant: Apple Inc., Cupertino, CA (US)

(72) Inventors: Bibo Li, San Jose, CA (US); Bo Yang, Santa Clara, CA (US); Vijay M. Bettada, Fremont, CA (US); Matthias Knoth, San Jose, CA (US); Toshinari Takayanagi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 64 days.

(21) Appl. No.: 16/375,344

(22) Filed: Apr. 4, 2019

(65) Prior Publication Data
US 2020/0319248 A1    Oct. 8, 2020

(51) Int. Cl.
G01R 31/317 (2006.01)
G01R 19/00 (2006.01)
H03M 1/12 (2006.01)
G01R 31/3177 (2006.01)

(52) U.S. Cl.
CPC ... *G01R 31/31725* (2013.01); *G01R 19/0038* (2013.01); *G01R 31/3177* (2013.01); *G01R 31/31707* (2013.01); *H03M 1/1205* (2013.01)

(58) Field of Classification Search
CPC .......... G01R 31/31725; G01R 19/0038; G01R 31/31707; G01R 31/3177; H03M 1/1205
USPC ....... 714/735, 731, 733, 738, 740, 741, 742, 714/744, 745
See application file for complete search history.

(56) References Cited

U.S. PATENT DOCUMENTS

| | | | |
|---|---|---|---|
| 5,353,243 A * | 10/1994 | Read | G06F 30/33 703/2 |
| 5,835,506 A | 11/1998 | Kuglin | |
| 5,905,577 A | 5/1999 | Wilsher et al. | |
| 6,260,166 B1 * | 7/2001 | Bhavsar | G01R 31/31705 714/727 |
| 6,684,169 B2 * | 1/2004 | Masella, Jr. | G01R 31/318342 702/66 |
| 6,980,943 B2 * | 12/2005 | Aitken | G01R 31/31813 703/13 |
| 7,228,464 B2 | 6/2007 | Wilsher | |

(Continued)

OTHER PUBLICATIONS

Dasnurkar et al., Real-Time Dynamic Hybrid BiST Solution for Very-Low-Cost ATE Production Testing of A/D Converters with Controlled DPPM, 2010, IEEE, pp. 562-569. (Year: 2010).*

(Continued)

*Primary Examiner* — John J Tabone, Jr.
(74) *Attorney, Agent, or Firm* — Kowert, Hood, Munyon, Rankin & Goetzel, P.C.

(57) ABSTRACT

An apparatus includes a functional circuit, including a power supply node, and a test circuit. The functional circuit is configured to operate in a test mode that includes generating respective test output patterns in response to application of a plurality of test stimulus patterns. The test circuit is configured to identify a particular test stimulus pattern of the plurality of test stimulus patterns, and to reapply the particular test stimulus pattern to the functional circuit multiple times. The test circuit is further configured to vary, for each reapplication, a start time of the particular test stimulus pattern in relation to when a voltage level of the power supply node is sampled for that reapplication.

20 Claims, 9 Drawing Sheets

(56) References Cited

U.S. PATENT DOCUMENTS

| | | | |
|---|---|---|---|
| 9,823,282 B2* | 11/2017 | Narayanan | G01R 31/3181 |
| 2003/0004663 A1* | 1/2003 | Masella, Jr. | G01R 31/3193 |
| | | | 702/66 |
| 2003/0076122 A1* | 4/2003 | Wilsher | G01R 19/00 |
| | | | 324/754.06 |
| 2003/0115033 A1* | 6/2003 | Aitken | G01R 31/318342 |
| | | | 703/14 |
| 2004/0123204 A1* | 6/2004 | Grimes | G01R 31/2853 |
| | | | 714/738 |
| 2005/0013355 A1* | 1/2005 | Smith | H04B 17/18 |
| | | | 375/224 |
| 2006/0093027 A1* | 5/2006 | Draving | H04L 1/205 |
| | | | 375/226 |
| 2006/0177018 A1* | 8/2006 | Kobayashi | H03M 1/1255 |
| | | | 379/88.07 |
| 2009/0074030 A1* | 3/2009 | Agoston | H04B 15/02 |
| | | | 375/130 |
| 2012/0047411 A1* | 2/2012 | Lai | G01R 31/31937 |
| | | | 714/721 |
| 2012/0286792 A1* | 11/2012 | Gorbold | G01R 31/396 |
| | | | 324/426 |
| 2013/0113777 A1* | 5/2013 | Baek | G09G 3/20 |
| | | | 345/212 |
| 2015/0128003 A1* | 5/2015 | Sartschev | G01R 31/31922 |
| | | | 714/744 |
| 2018/0284214 A1 | 10/2018 | Nerheim, Jr. et al. | |
| 2019/0086468 A1* | 3/2019 | Yoshino | G01R 31/2834 |
| 2019/0149258 A1* | 5/2019 | Araki | H04J 14/0201 |
| | | | 398/83 |

OTHER PUBLICATIONS

Li et al., Applications of Mixed-Signal Technology in Digital Testing, Mar. 11, 2016, Springer Science+Business Media New York, pp. 209-224 (Year: 2016).*

* cited by examiner

POWER DROOP MEASUREMENTS USING ANALOG-TO-DIGITAL CONVERTER DURING TESTING

BACKGROUND

Technical Field

Embodiments described herein are related to the field of circuit testing, and more particularly to test assist circuits.

Description of the Related Art

Computer systems and the components used to build them may be tested prior to being sold or assembled into larger systems. Various forms of testing may help to identify manufacturing defects, and to highlight design limitations and errors. In some instances, bugs and limitations in the tests themselves may be detected. Design and test engineers may be able to filter out defective devices, improve circuit designs, and improve tests based on test results.

Some testing procedures include use of a test system configured to generate and send a variety of stimulus patterns to a device-under-test, or DUT, and monitor output signals from the DUT to determine if a particular test passed or failed. In some types of testing, the test system may send stimulus patterns to the DUT that causes the DUT to activate and perform one or more tests that are built into the DUT itself to test particular features of the DUT. Such a test may be referred to as built-in self-test, or BIST, for short. In another type of testing, the test system may send stimulus patterns in the form of a series of logic signals to exercise particular circuitry in the DUT. Such testing is commonly referred to as scan testing and each series of logic signals may be referred to as a scan chain.

SUMMARY OF THE EMBODIMENTS

Broadly speaking, a system, an apparatus, and a method are contemplated in which the apparatus includes a functional circuit, including a power supply node, and a test circuit. The functional circuit may be configured to operate in a test mode that includes generating respective test output patterns in response to application of a plurality of test stimulus patterns. The test circuit may be configured to identify a particular test stimulus pattern of the plurality of test stimulus patterns, and to reapply the particular test stimulus pattern to the functional circuit multiple times. For example, the test circuit may identify the particular test stimulus pattern based on a voltage level of a power supply node during applications of the plurality of test stimulus patterns. The test circuit may further be configured to vary, for each reapplication, a start time of the particular test stimulus pattern in relation to when a voltage level of the power supply node is sampled for that reapplication.

In one example, the test circuit may be further configured to reapply the particular test stimulus pattern by asserting a pattern start signal to start a reapplication of the particular test stimulus pattern, and by asserting a sample start signal to initiate a sample of a voltage level of the power supply node. The test circuit may be further configured, for each successive reapplication of the particular test stimulus pattern, to vary the start time of the particular test stimulus pattern relative to sample start signal. To vary the start time, the test circuit may decrease an amount of time, e.g., from a test start signal, before asserting the pattern start signal for each reapplication of the particular test stimulus pattern.

In another example, the test circuit may be further configured to store a plurality of samples of the voltage level of the power supply node, and to identify, using the plurality of samples, a particular portion of the particular test stimulus pattern based on one of the plurality of samples that exhibits a particular characteristic. In a further example, the particular characteristic is a lowest voltage level within the plurality of samples.

In some embodiments, the test circuit may include an analog-to-digital converter (ADC) circuit that, during a particular mode of operation, is configured to identify a minimum voltage level of the power supply node at a particular sampling rate. To identify the particular one of the plurality of test stimulus patterns, the test circuit may be further configured to enable the particular mode of the ADC circuit to select one of the plurality of test stimulus patterns that corresponds to a minimum voltage level on the power supply node.

In a further example, the ADC circuit may, during a different mode of operation, be further configured to determine a digital value representing the voltage level of the power supply node at a different sampling rate that is slower than the particular sampling rate. To sample the voltage level of the power supply node during reapplication of the particular test stimulus pattern, the test circuit may be further configured to use the different mode of the ADC circuit.

In another example, the test circuit may include a minimum voltage register and a pattern index register. The test circuit may be further configured to store a value indicating a current test stimulus pattern being applied into the pattern index register in response to a value being stored into the minimum voltage register.

BRIEF DESCRIPTION OF THE DRAWINGS

The following detailed description makes reference to the accompanying drawings, which are now briefly described.

Figure 1:
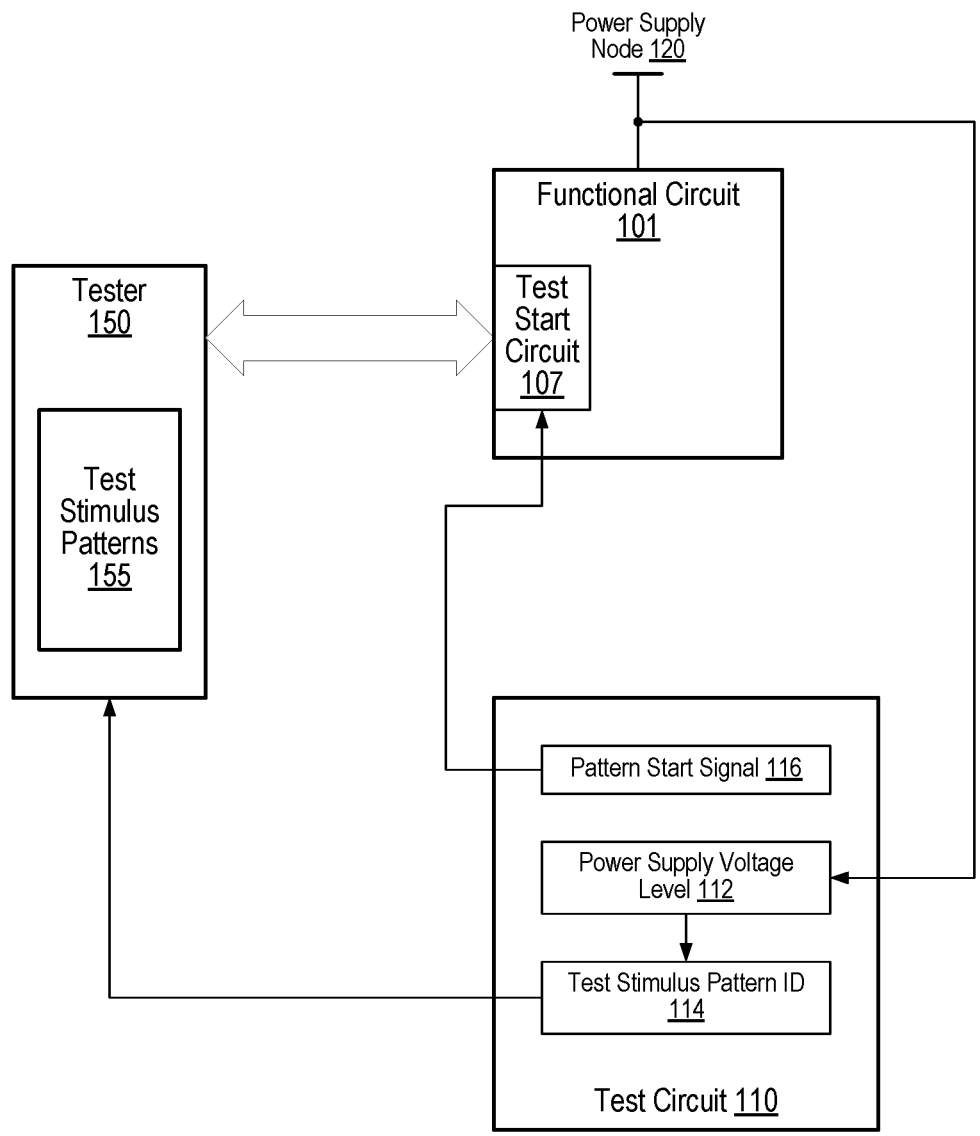
FIG. 1 illustrates a block diagram of an embodiment of a system for testing a functional circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Testing may be performed on computer systems and integrated circuits to detect manufacturing defects, design errors, design limitations, and the like. In addition to identifying defective devices and highlighting potential design improvements, results from testing may be used to improve the test methods themselves. Testing an electronic circuit may cause the circuit to operate in a manner that is not comparable to real world operation of the circuit. Functional tests, e.g., tests that cause the circuit to operate in a similar manner as they function, may be limited in regards to test coverage (the number of flip-flops and logic gates that are exercised in a given test). Improving test coverage may require use of many functional test patterns to cover multiple combinations of use cases. Use of multiple functional test patterns may be time consuming, thereby increasing test cost, and may still fail to exercise a desired number of flip-flops and logic gates.

BIST and scan tests may be used to reduce test times and test costs. These tests may be implemented for a circuit design such that the circuit operates in a manner that is not consistent with normal operation of the circuit. BIST and scan test patterns may be used to cause many flip-flops and logic gates in the circuit to toggle their respective outputs in as short as time as possible, thereby testing functionality of these circuits quickly, and potentially reducing test times and, therefore, test costs. A potential issue with exercising a greater number of flip-flops and gates in parallel is that the increased activity causes a corresponding increase in current demand due to switching in the circuits. Sudden increases in current demand may result in power droop. As used herein, "power droop" refers to when a voltage level of a power supply signal decreases in response to an increase in current demand. Power droop results from a power supply not being able to source current at a same rate of change as circuits demand. Conversely, when flip-flop and gate activity ceases, the sudden decrease in activity may cause a decrease in current demand which may result in a power spike. As used herein, a "power spike" refers to when a voltage level of a power supply signal increases in response to a decrease in current demand. Power spikes and power droop may last until the power supply, e.g., a voltage regulator, is able to adjust an amount of current to match the demand.

Power droop may, in some instances, cause a low power condition in which the voltage level of the power supply drops below a minimum operating voltage level of the circuit. Power spikes may, in some cases, cause an over-voltage condition in which the power supply level exceeds a safe maximum operating level for the circuit. Depending on a severity of a power droop or power spike (collectively referred to herein as "power anomalies"), operation of the circuit may disrupted, potentially causing a temporary operational glitch or even causing the circuit to enter an unknown operational state that requires a reset or full power down of the circuit in order to recover. Design and test engineers, therefore, may have a desire to identify test patterns that cause the highest degree of power anomalies. A given test pattern may include many clock cycles of stimulus, making it difficult to determine which portion of the test pattern resulted in the most power fluctuation. Accordingly, once a test pattern is identified that causes a power anomaly, identifying the particular portion that results in the largest voltage deviation may allow engineers to identify a specific cause for the anomaly and, in response, determine if a circuit change and/or test pattern change is warranted to reduce the amount of voltage deviation in the power supply.

Embodiments of apparatus and methods for identifying power anomalies within test stimulus patterns are disclosed herein. The disclosed embodiments demonstrate methods for identifying a particular test stimulus pattern that causes a power anomaly and then re-applying the particular test stimulus pattern to identify a particular portion of the pattern that causes the largest voltage deviation.

A block diagram for an embodiment of a test system for a functional circuit is illustrated in FIG. 1. Test system 100 includes functional circuit 101 as a device-under-test (DUT), test circuit 110, and tester 150. Functional circuit 101 includes test start circuit 107. Test circuit 110 includes registers for storing values such as power supply voltage level 112 and test stimulus pattern identifier (ID) 114, and includes a circuit for generating pattern start signal 116. Tester 150 includes circuits and memory for storing and generating test stimulus patterns 155.

As illustrated, functional circuit 101 is a DUT to be tested using tester 150 in conjunction with test circuit 110. Functional circuit 101 may be any suitable type of electronic circuit, for example, a desktop or laptop computer, smartphone, tablet computer, wearable device, and the like. In some embodiments, functional circuit 101 may be a component of these examples, such as a circuit board or a single integrated circuit such as a system-on-chip (SoC). Functional circuit 101 receives power via power supply node 120.

Tester 150 is a computing system configured to apply test stimulus patterns 155 to functional circuit 101, causing functional circuit 101 to generate respective test output patterns. To apply a given one of test stimulus patterns 155, tester 150 generates one or more test signals based on information included in one of test stimulus patterns 155. These test signals are received by functional circuit 101. Tester 150 receives a respective test output pattern from functional circuit 101 in response to an application of a corresponding one of test stimulus patterns 155. Tester 150 determines if the corresponding one test stimulus pattern passed or failed the test based on a comparison of the received test output pattern to an expected test output pattern. Information regarding the expected test output signals may be included within the corresponding one test stimulus pattern or may be included within a different test pattern.

Tester 150, as shown, includes any suitable combination of hardware, firmware, and software required for accessing test stimulus patterns 155 and converting the information in a given test stimulus pattern into the one or more test signals that are sent to functional circuit 101. These signals may cause functional circuit 101 to enter any one of a number of supported test modes (e.g., functional, BIST, and scan test modes). As used herein, "applying a test stimulus pattern" refers to the generation of test signals by tester 150 based on the applied test stimulus pattern and sending the signals to functional circuit 101 via a conductive interface.

As shown, test circuit 110 may be utilized to synchronize the application of test stimulus patterns to functional circuit 101. In the embodiments disclosed herein, test circuit 110 is included on a same integrated circuit as functional circuit 101. It is contemplated, however, that in other embodiments, test circuit 110 may be included on a same circuit board, but different integrated circuit, as functional circuit 101, on a different circuit board from both functional circuit 101 and tester 150, or included as a part of tester 150.

Functional circuit 101 is configured to operate in a test mode that includes generating respective test output patterns in response to application of test stimulus patterns 155 by tester 150. This test mode may correspond to any one of a functional test mode, a BIST mode, or a scan test mode. Test circuit 110 is configured to identify a particular test stimulus pattern of test stimulus patterns 155. Test circuit is also coupled to power supply node 120 and is configured to sample a voltage level on power supply node 120 node while each of test stimulus patterns 155 are applied to functional circuit 101. Test circuit 110 identifies the particular test stimulus pattern based on these voltage level samples. For example, test circuit 110 may be configured to identify the particular test stimulus pattern based on power droop on power supply node 120 when each pattern is applied. The particular test stimulus pattern may be selected based on which of test stimulus patterns 155 corresponds to a lowest one of the sampled voltage levels. In other embodiments, the particular test stimulus pattern may be selected based on identifying one of test stimulus patterns 155 that corresponds to a highest one of the sampled voltage levels.

To determine which of test stimulus patterns 155 corresponds to the lowest sampled voltage, test circuit 110 tracks the minimum sampled voltage level as power supply voltage level 112. Power supply voltage level 112, therefore, is a value corresponding to a lowest sampled voltage level of power supply node 120 for test stimulus patterns that have been applied. As samples of power supply node 120 are taken, if the sampled voltage level is less than a current value of power supply voltage level, then the new lowest sampled voltage level becomes the new value of power supply voltage level 112. Additionally, test circuit 110 tracks which one of test stimulus patterns 155 is currently being applied by tester 150. When a new lowest sampled voltage level is detected, test circuit records an identifier for the currently applied test stimulus pattern as test stimulus pattern ID 114. Tester 150 may apply one or more of test stimulus patterns as a particular test batch. When a particular test batch has completed, power supply voltage level 112 indicates the lowest voltage level of power supply node 120 that was sampled and test stimulus pattern ID 114 indicates which test pattern of test stimulus patterns 155 was being applied at the time that the lowest voltage level was sampled, thereby identifying the particular test stimulus pattern. This process may also be used to identify a maximum sampled voltage level.

After identifying the particular test stimulus pattern of test stimulus patterns 155, test circuit 110 reapplies the particular test stimulus pattern to functional circuit 101 multiple times, varying, for each reapplication, a start time of the particular test stimulus pattern in relation to when a voltage level of power supply node 120 is sampled for that reapplication. For example, test circuit 110 sends test stimulus pattern ID 114 to tester 150 to indicate which of test stimulus patterns 155 is to be reapplied multiple times. For each reapplication of the particular test stimulus pattern, test circuit 110 samples a voltage level of power supply node 120 at a different point in time relative to the beginning of the particular test stimulus pattern. Test circuit 110 may sample the voltage level of power supply node 120 at a predetermined amount of time after a test start signal is asserted for each application of the particular test stimulus pattern. In various embodiments, the test start signal may be asserted by tester 150 or test circuit 110.

After a particular delay from the assertion of the test start signal, test circuit 110 asserts pattern start signal 116 to indicate when the particular test stimulus pattern may be applied to functional circuit 101. Test start circuit 107 receives pattern start signal 116 and may, in turn, signal tester 150 to send pattern signals corresponding to the particular test stimulus pattern. For each application of the particular test stimulus pattern, test circuit 110 decreases a delay between the assertion of the test start signal and the assertion of pattern start signal 116. This decrease in the delay causes the voltage level sample of power supply node 120 to occur at a different point in the application of the particular test stimulus pattern. Test circuit 110 stores each of the voltage level samples, resulting in a series of data points corresponding to the voltage level of power supply node 120 during the course of the application of the particular test stimulus pattern. Using this series of voltage level data points, test circuit 110 may identify a particular portion of the particular test stimulus pattern based on one of the series of voltage level data points that exhibits a particular characteristic, such as a lowest voltage level of the series. In some embodiments, this series of voltage level data points may be sent to tester 150, at which point the data may be accessible by design and test engineers and used to evaluate conditions leading to a power droop associated with the lowest sampled voltage level.

It is noted in the illustrated embodiment that, to vary a time between a start of a reapplication of the particular test stimulus pattern and a sample time of the voltage level of the power supply node, a delay between the test start signal and the sample time of the voltage level is fixed, while a delay between the test start signal and the pattern start signal is varied. In other embodiments, this may be reversed with the pattern start signal being asserted at a fixed delay from the test start signal and a delay between the test start signal and the voltage level sample time being varied.

It is also noted that the test system illustrated in FIG. 1 is merely an example. Test system 100 includes only the functional blocks necessary to demonstrate the disclosed concepts. In other embodiments, additional functional circuits may be included, such as power management units, clock generation modules, and the like. Test system 100 may be implemented using a variety of different circuits. One such implementation for test circuit 110 is shown in FIG. 2.

Figure 2:
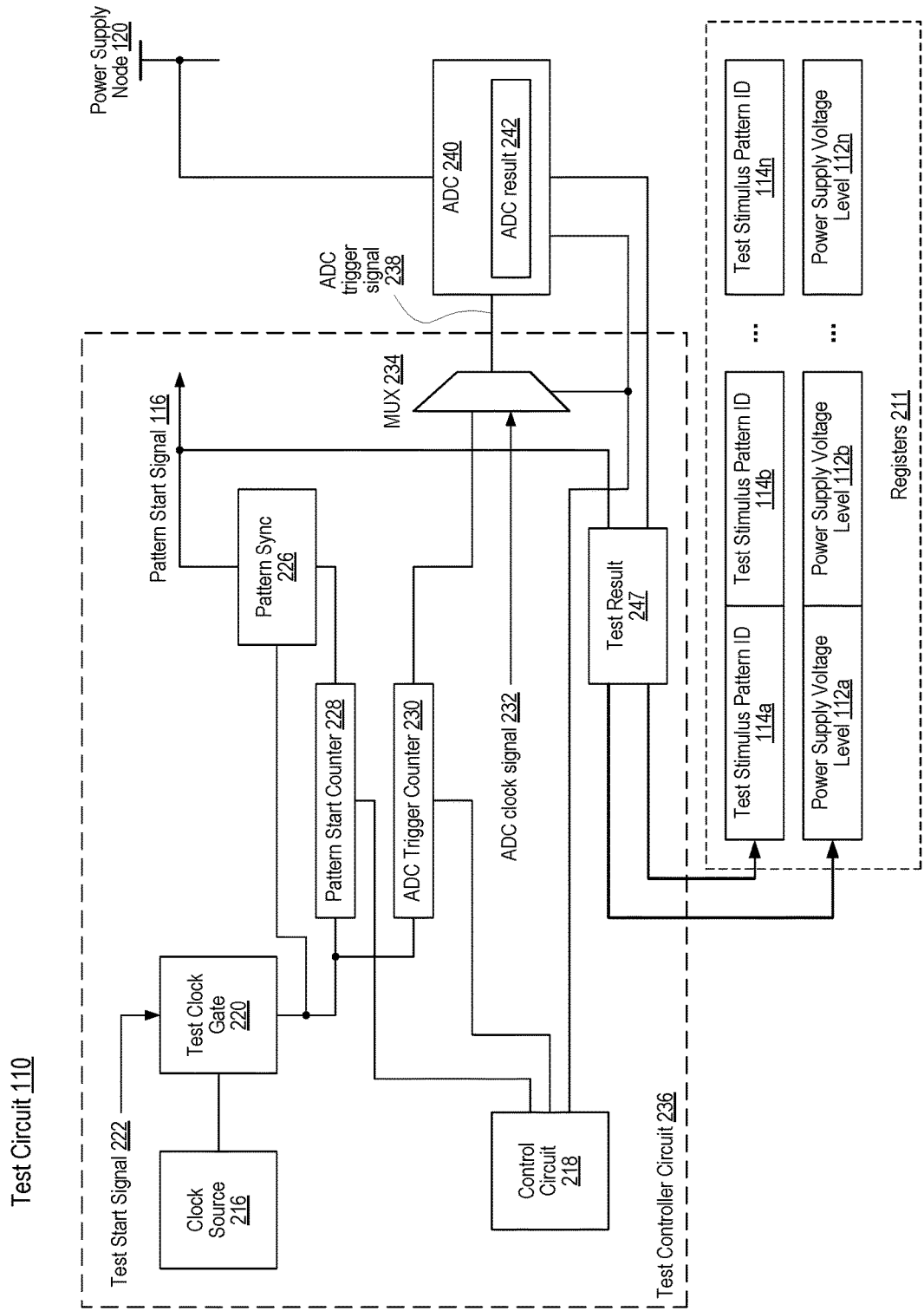
FIG. 2 shows a block diagram of an embodiment of a test circuit.

Moving to FIG. 2, a block diagram for a test circuit used in a test system is shown. Test circuit 110 includes test controller circuit 236, analog-to-digital converter (ADC) circuit 240, and registers 211. Test controller circuit 236 includes clock source 216, test clock gate 220, pattern synchronization circuit (pattern sync) 226, multiplexor circuit (MUX) 234, pattern start counter 228, ADC trigger counter 230, and test result circuit 247. In various embodiments, test circuit 110 may be included in an IC with functional circuit 101, in tester 150, or as a separate component in test system 100 in FIG. 1.

As shown in FIG. 2, test controller circuit 236, is configured to initiate application of a series of test stimulus patterns 155 to functional circuit 101 and initiate a plurality of samples of the voltage level of the power supply node during the application of the series. In various embodiments, test controller circuit 236 may receive or generate test start signal 222 to indicate a start to a particular test. Test start signal 222 causes test clock gate 220 to open and allow a clock signal from clock source 216 to pass and be received by pattern start counter 228. Pattern start counter 228 is used in the illustrated embodiment to set a timing delay from an assertion of test start signal 222 to when one of test stimulus patterns 155 begins to be applied to functional circuit 101. When a count has completed in pattern start counter 228, a signal is asserted causing pattern sync 226 to assert pattern start signal 116, thereby enabling test start circuit 107 to apply a current one of test stimulus patterns 155 to functional circuit 101. In some embodiments, pattern start signal 116 may include a pattern clock signal.

As illustrated, ADC circuit 240 is configured to sample a voltage level of power supply node 120. To perform the sampling operations, ADC circuit 240 operates in one of two modes: a normal mode of operation, and a level detection mode. During the normal mode, ADC circuit 240 determines a digital value representing the voltage level of power supply node 120 at a particular sampling rate. In the normal mode, ADC circuit 240 receives ADC trigger signal 238 from test controller circuit 236, samples the voltage level of power supply node 120 and generates a digital value corresponding to the sampled voltage level and stores the digital value in ADC result register 242. As used herein, the "digital value" is a binary number consisting of a suitable number of data bits to provide an acceptable resolution and level of accuracy for the voltage level samples. ADC trigger counter 230 is used to set a delay from the assertion of test start signal 222 to an assertion of ADC trigger signal 238. For example, when a count has completed in ADC trigger counter 230, ADC trigger signal 238 may be asserted, causing ADC circuit 240 to initiate the sample of power supply node 120.

During the level detection mode of operation, ADC circuit identifies a minimum (or maximum) voltage level of power supply node 120 using a sampling rate that is higher than the particular sampling rate of the normal mode. At a beginning of a time period, ADC circuit 240 uses two or more sampling nodes to sample power supply node 120 at subsequent sampling times. A sampling node with the minimum (or maximum) voltage level retains the voltage level sample while the remaining sampling nodes are used to capture new voltage levels at subsequent sampling times and the comparison between the sampling nodes is repeated, with the sampling node with the minimum (or maximum) voltage level retaining its voltage level. At an end of the time period, a digital value of the voltage level of the sampling node with the minimum (or maximum) voltage level is generated and stored in ADC result register 242. The value in ADC result register 242 corresponds to the minimum (or maximum) voltage level detected during the time period. ADC circuit 240 may be able to utilize the higher sampling rate by performing a more simplified comparison between the two or more sampling nodes rather than performing a complete analog-to-digital conversion. For example, a simplified comparison may be made between the voltage levels on each of the two or more sampling nodes. A complete analog-to-digital conversion may be postponed until the end of the time period when the sampling node corresponding to the minimum (or maximum) voltage level is used for the conversion.

In the level detection mode, ADC trigger signal 238 may correspond to ADC clock signal 232 instead of a signal assertion from ADC trigger counter 230. Control circuit 218 generates a selection signal that causes MUX 234 to select either the output of ADC trigger counter 230 or ADC clock signal 232 as a source for ADC trigger signal 238. This same selection signal may be used to select either the normal mode or the level detection mode of operation for ADC circuit 240.

Test controller circuit 236 is configured to identify a particular one of test stimulus patterns 155. For example, using control circuit 218, test controller circuit 236 enables the level detection mode of ADC circuit 240 to select the one of test stimulus patterns 155 that is active when a minimum voltage level on power supply node 120 is detected. For example, test controller circuit 236 may enable ADC circuit 240 to operate in the level detection mode for time periods corresponding to the application of each of test stimulus patterns 155, such that ADC circuit 240 determines a minimum voltage level of power supply node 120 for each pattern of test stimulus patterns 155. After a result is generated at the end of a particular test stimulus pattern, the value of ADC result register 242 is read by test result circuit 247 and matched to an identifier for the particular test stimulus pattern. The test stimulus pattern identifier and the ADC result value are then stored in one pair of registers 211, such as test stimulus pattern ID 114*b* and power supply voltage level 112*b*.

After all of (or in some embodiments, a particular subset of) test stimulus patterns 155 have been applied and resulting minimum voltage levels of power supply node 120 have been sampled and stored in registers 211, then control circuit 218 may identify which of power supply voltage level registers 112*a*-112*n* stores a minimum value. Control circuit 218 may then read the test stimulus pattern ID register 114*a*-114*n* that corresponds to the identified power supply voltage level register 112*a*-112*h*. Control circuit 218 may further record the test stimulus pattern ID in a particular one of registers 211.

In other embodiments, registers 211 may include a single power supply voltage level register 112 and a single test stimulus pattern ID register 114. Instead of storing a test stimulus pattern ID value and power supply voltage level value for each applied test stimulus pattern, test result circuit 247 may store a value identifying the corresponding test stimulus pattern into the single test stimulus pattern ID register 114 along with the sampled value in the single power supply voltage level register 112 in response to ADC circuit 240 detecting a new lowest voltage level. For example, after each of test stimulus patterns 155 are applied, the corresponding result in ADC result register 242 is compared to the current value in the single power supply voltage level register 112. If the value in ADC result register 242 is lower, then the value in ADC result register 242 is copied in the single power supply voltage level register 112 and the corresponding pattern ID value is stored in the single test stimulus pattern ID register 114.

As illustrated, test controller circuit 236 is configured to initiate repeat applications of the particular test stimulus pattern to functional circuit 101. For example, control circuit 218 sends the test stimulus pattern ID value corresponding to the lowest sampled power supply voltage level value to tester 150, causing tester 150 to repeatedly apply the identified test stimulus pattern to functional circuit 101. For each application, test controller circuit 236 causes ADC circuit 240 to sample a voltage level of power supply node 120 at a different point in time relative to the beginning of the particular test stimulus pattern.

For example, to sample the voltage level of power supply node 120 during reapplication of the identified test stimulus pattern, control circuit 218 may be configured to select the normal mode of operation of the ADC circuit. In some embodiments, ADC trigger counter 230 may be set to a constant value for each application of the identified test stimulus pattern, thereby causing ADC circuit 240 to sample power supply node 120 at a regular interval. Control circuit 218 may then decrement a value in pattern start counter 228 for each application, resulting in less time between an assertion of the control signal by pattern start counter 228 and a corresponding assertion of ADC trigger signal 238 by ADC trigger counter 230. As a result, a plurality of samples of the voltage level of power supply node 120 are collected and may be stored in power supply voltage level registers 112a-112n. Since each of the plurality of samples corresponds to a different delay from the start of the identified test stimulus pattern, a particular portion of the identified test stimulus pattern may be identified that corresponds to a minimum value of the plurality of samples. In some embodiments, control circuit 218 may identify the particular portion and store an indication of the particular portion in registers 211, and/or send the indication to tester 150. In other embodiments, control circuit 218 may send the plurality of samples to tester 150, where a user of tester 150 may access the plurality of samples.

By identifying the particular portion of a test stimulus pattern that corresponds to a lowest voltage level on power supply node 120, a test and/or a design engineer may be able to determine particular stimulus and/or sub-circuits in functional circuit 101 that caused this power droop and implement a corrective action to reduce an amount of the power droop. For example, a portion of functional circuit 101 may be redesigned to reduce the power consumption during the identified stimulus, or a power supply may be redesigned to increase an ability to supply current to power supply node 120 to avoid the power droop. In other cases, the test stimulus may be changed to avoid enabling the circuit conditions that caused the power droop. By addressing a cause of the power droop, testing of functional circuit 101 may be improved, resulting in more accurate test results.

It is noted that in the above example, minimum voltage levels are determined, thereby identifying points of power droop. It is contemplated that similar test procedures may be used to identify maximum voltage levels, thereby identifying points of power spikes. Similar measures may be taken by design and test engineers to avoid conditions that result in power spikes and further improve an accuracy of test results.

Figure 3:
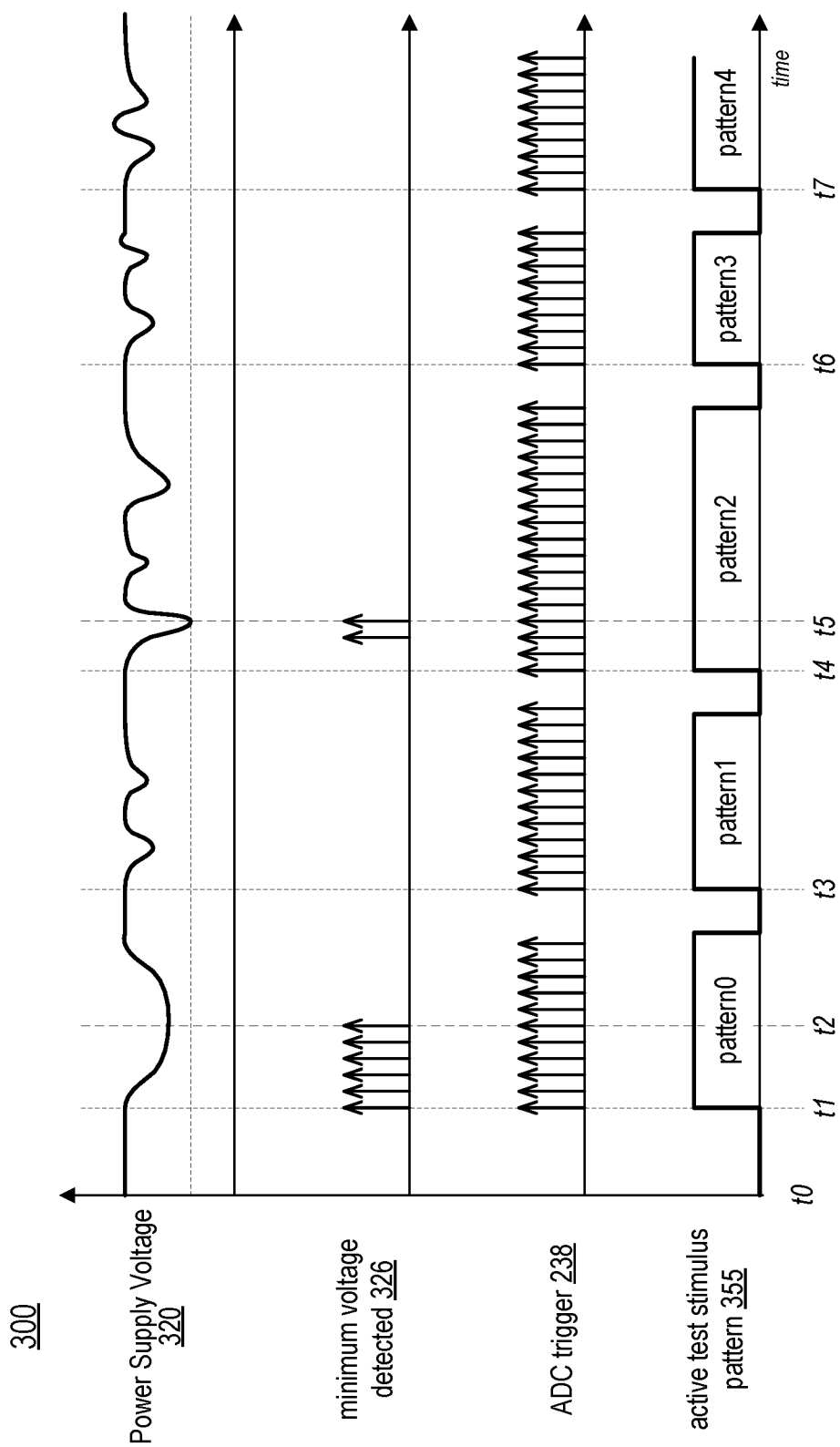
FIG. 3 depicts a timing diagram of waveforms associated with an embodiment of a test system.

FIGS. 1 and 2 describe circuits used within a test system. Turning to FIG. 3 a chart that depicts possible waveforms that may be associated with the operation of a test system is shown. The waveforms of chart 300 may be associated with test circuit 110 illustrated in FIGS. 1 and 2. Chart 300 includes four waveforms: power supply voltage 320, active test stimulus pattern 355, ADC trigger signal 238, and minimum voltage detect 326. Power supply voltage 320 corresponds to a voltage level of power supply node 120 over time. Active test stimulus pattern 355 indicates which of test stimulus patterns 155 is active at a given point in time. ADC trigger signal 238 represents the signal by the same name in FIG. 2 and is shown as a series of arrows, each arrow indicating a point in time when ADC circuit 240 samples power supply voltage 320. Minimum voltage detected 326 is also represented as a series of arrows, each arrow indicating a point in time at which ADC circuit 236 has sampled a minimum voltage on power supply voltage 320. For the test operations performed in chart 300, ADC circuit 240 is set to operate in the level detection mode. ADC trigger signal 238 may be asserted based on ADC clock signal 232.

As shown, the chart begins at time t0 with active test stimulus pattern 355 low indicating that no test patterns are currently being applied to functional circuit 101. Power supply voltage 320 is at a steady level and no ADC trigger signals 238 have been asserted. At time t1, as indicated by active test stimulus pattern 355, pattern0 becomes active and ADC trigger signal 238 is asserted causing ADC circuit 240 to sample power supply voltage 320. As illustrated, this is the first ADC trigger signal 238, therefore ADC circuit 240 captures this sample as current minimum sampled value, as indicated by minimum voltage detected 326. Between time t1 and time t2, the level of power supply voltage 320 falls, resulting in each assertion of ADC trigger signal 238 up to time t2 generating a new minimum sampled value. At time t2, the level of power supply voltage 320 starts to rise and remains above the sampled value taken at time t2 through the end of pattern0. The time t2 sample, therefore, reflects the minimum level of power supply voltage 320 sampled during pattern0. The value of the time t2 sample and a value indicative of pattern0 may be stored by test circuit 110, for example, in power supply voltage level 112a and test stimulus pattern ID 114a, respectively.

At time t3, pattern1 is started and ADC trigger signal 238 is asserted multiple times. During the application of pattern1, however, the level of power supply voltage 320 does not fall below the level measured at time t2, resulting in no new minimum voltage samples being captured, as indicated by minimum voltage detected 326. At time t4, pattern2 is applied and the level of power supply voltage 320 begins falling. Just before time t5, the level of power supply voltage 320 falls below the level from the time t2 sample, resulting in ADC circuit 240 capturing a new minimum voltage sample. At time t5, the level of power supply voltage 320 has continued to fall and another new minimum voltage sample is captured by ADC circuit 240.

After time t5, the level of power supply voltage 320 rises above the level of the time t5 sample. The level of power supply voltage 320 fluctuates up and down through the remainder of pattern2, but does not fall below the value of the time t5 sample. The value of the time t5 sample and a value indicative of pattern2 may be stored by test circuit 110, for example, in power supply voltage level 112*b* and test stimulus pattern ID 114*b*, respectively.

At time t6, pattern3 is applied and at time t7, pattern4 is applied. The level of power supply voltage 320, however, does not fall below the value of the time t5 sample during either pattern3 or pattern4. If the application of test patterns to functional circuit 101 ends with pattern4, or if no samples by ADC circuit 240 are below the value of the t5 sample, then test circuit 110 may identify pattern2 as the test pattern that results in the minimum level of power supply voltage 320. Test circuit 110 may then send an indication to tester 150 to reapply pattern2 to functional circuit 101 multiple times.

Figure 4:
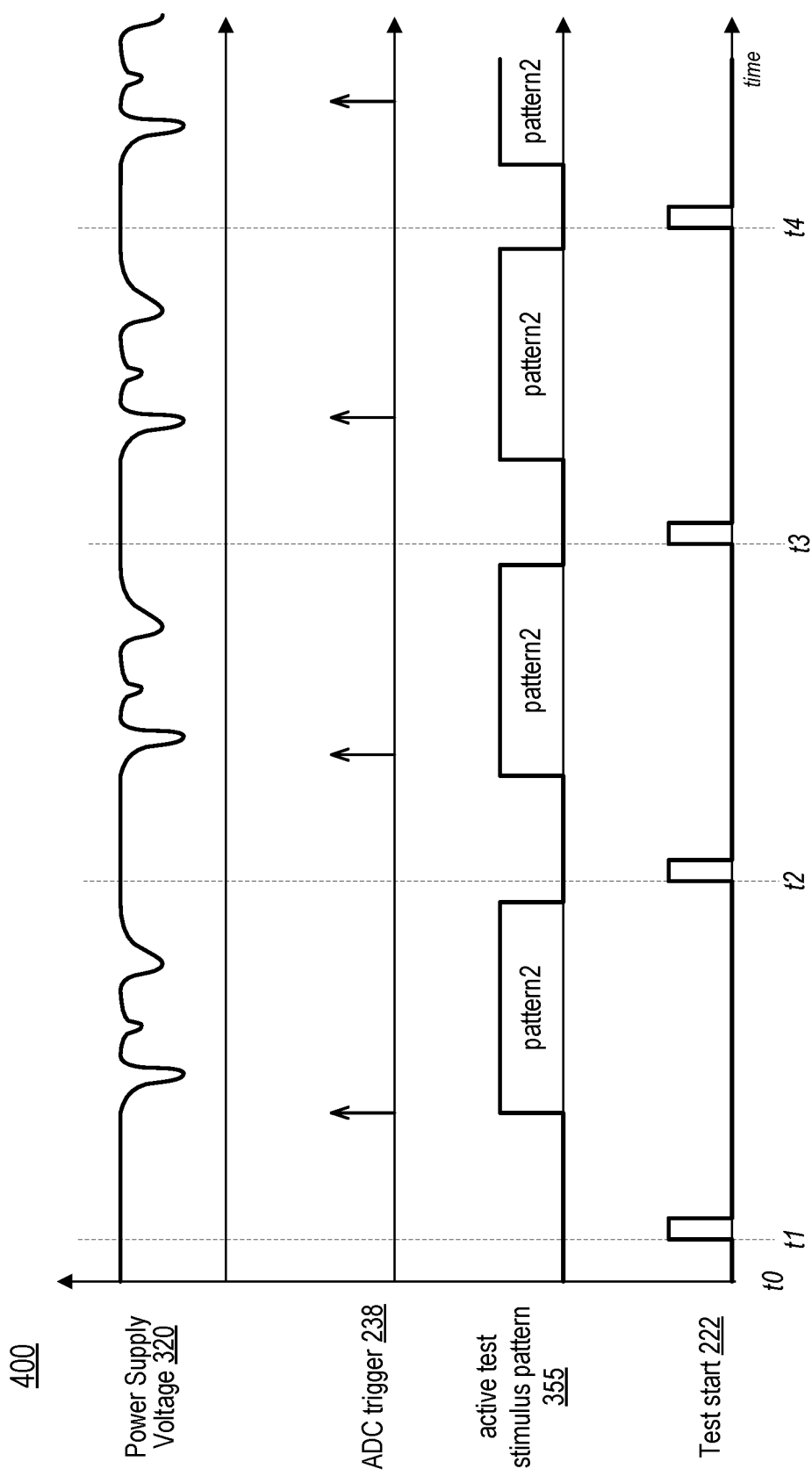
FIG. 4 presents another timing diagram depicting waveforms associated with an embodiment of a test system.

Proceeding to FIG. 4, a chart of possible waveforms associated with this reapplication of pattern2 is depicted. Similar to chart 300, the waveforms of chart 400 may be associated with test circuit 110 illustrated in FIGS. 1 and 2. Chart 400 includes three waveforms for signals described in regards to chart 300: power supply voltage 320, active test stimulus pattern 355, and ADC trigger signal 238. Chart 400 also includes the waveform test start signal 222 representing the signal by the same name in FIG. 2. Test start signal 222 transitions high as an indication to begin an iteration of a test operation. For the test operations performed in chart 400, ADC circuit 240 is set to operate in the normal mode. ADC trigger signal 238 is asserted based on a value in ADC trigger counter 230. This value in ADC trigger counter 230 may remain at the same value throughout the test operations performed in the time frame shown in chart 400, resulting in ADC trigger signal 238 being asserted at a same time after each assertion of test start signal 222.

Chart 400, as illustrated, begins at time t0 with active test stimulus pattern 355 low indicating that no test pattern is currently being applied to functional circuit 101. Test start signal 222 is low, power supply voltage 320 is at a steady level, and ADC trigger signal 238 has not been asserted. At time t1, test start signal 222 is asserted, indicating a start to a first iteration of a test operation including a first reapplication of pattern2. As disclosed, ADC trigger signal 238 is asserted after a same delay from the assertion of test start signal 222. Application of pattern2, as indicated by active test stimulus pattern 355 is also started after a delay from the assertion of test start signal 222. This delay for the start of pattern2 is based on a value in pattern start counter 228. For the first iteration of pattern2, ADC trigger signal 238 is asserted near the beginning of the application of pattern2.

As shown, for each subsequent assertion of test start signal 222 at time t2, t3, and t4, the value in pattern start counter 228 is reduced each time. This reduction in the value in pattern start counter 228 results in pattern2 being started earlier in relation to assertions of test start signal 222 and ADC trigger signal 238. ADC trigger signal 238, therefore, is asserted later in the application of pattern2 for each iteration, allowing ADC circuit 240 to sample power supply voltage 320 at different points in the application of pattern2, thereby identifying a portion of pattern2 that corresponds to a lowest value of the voltage samples taken by ADC circuit 240.

A value of each ADC sample may be stored in one of registers 211. In some embodiments, for example, a first sample may be stored in power supply voltage level 112*a*, a second sample in power supply voltage level 112*b*, and so on until the reapplications of pattern2 have completed. The stored values in registers 211 may then be compared to determine a lowest voltage sample. In other embodiments, a single one of registers 211 may be used and a new sample value stored in the one register if the new value is less than an existing value. In the example of chart 400, a lowest value of power supply voltage 320 is sampled during the third iteration beginning at time t3. In some embodiments, an indication of the portion of pattern2 that corresponds to the time a respective voltage value was sampled may also be stored in registers 211. In various embodiments, the indication may be a particular number of pattern iterations, a number identifying a particular sample of the stored voltage samples, or other value that may be used as the indication of the portion.

It is noted that the charts in FIGS. 3 and 4 show waveforms associated with identifying a lowest voltage level occurring on a power supply node during applications of test stimulus patterns. In other embodiments, however, the waveforms may be associated with identifying a highest voltage level occurring on the power supply node. In addition, the waveforms of the illustrated charts in these figures are simplified for clarity. In other embodiments, these waveforms may appear different due to effects of circuit design, such as rise and fall times of transistors and/or due to noise coupled from other circuits in the test system.

Figure 5:
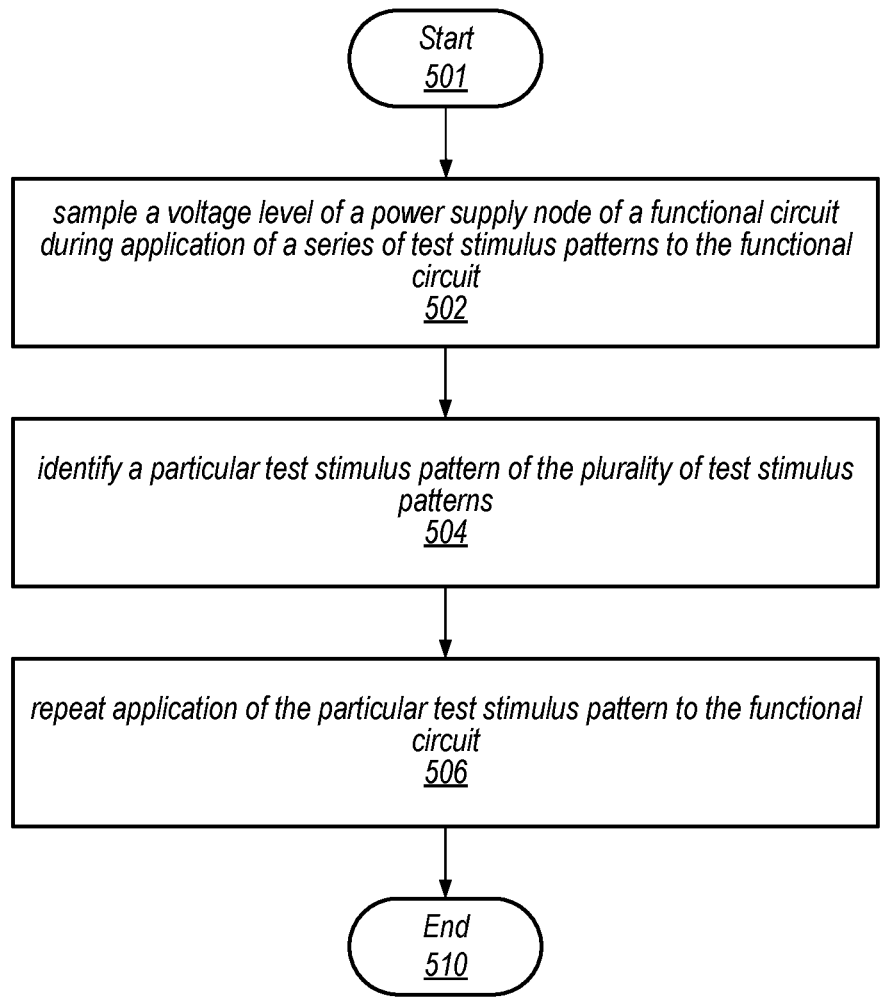
FIG. 5 illustrates a flow diagram of an embodiment of a method for operating a test circuit.

Moving now to FIG. 5, a flow diagram illustrating an embodiment of a method for operating a test system is shown. Method 500 may be applied to circuits in test system 100 disclosed in FIGS. 1 and 2, such as test circuit 110. Referring collectively to test circuit 110 in FIGS. 1 and 2, and the flow diagram in FIG. 5, method 500 begins in block 501.

A test circuit samples a voltage level of a power supply node of a functional circuit during application of a series of test stimulus patterns to the functional circuit (block 502). As illustrated, test circuit 110 repeatedly samples power supply node 120 while tester 150 applies at least a subset of test stimulus patterns 155 to functional circuit 101. In some embodiments, test circuit utilizes ADC circuit 240 to sample power supply node 120. ADC circuit 240 may be set to operate in a level detection mode while the plurality of test stimulus patterns 155 is applied.

The test circuit identifies a particular test stimulus pattern of the plurality of test stimulus patterns (block 504). In various embodiments, test circuit 110 may use any suitable criteria to identify the particular test stimulus pattern. For example, test circuit 110 may identify a test stimulus pattern during which a lowest or a highest voltage level is sampled. In some embodiments, test circuit 110 may identify a test stimulus pattern in which a largest voltage level delta is observed from one sample to a next. As shown, test circuit 110 uses the level detection mode of ADC circuit 240 to determine which of the plurality of test stimulus patterns corresponds to a lowest sampled voltage level on power supply node 120.

The test circuit repeats application of the particular test stimulus pattern to the functional circuit (block 506). As illustrated, test circuit 110 provides the identity of the particular test stimulus pattern to tester 150. Tester 150 reapplies the particular test stimulus pattern in response to pattern start signal 116. In some embodiments, test circuit 110 may send a pattern start signal directly to tester 150. For example, sending the identity of the particular test stimulus pattern to tester 150 may correspond to a pattern start signal. As shown, pattern start signal 116 is sent to test start circuit 107 in functional circuit 101. Test start circuit 107 may include circuits for communicating with tester 150, including circuits that start and synchronize the application of a test stimulus pattern to functional circuit 101.

The repeating of the particular test stimulus pattern may be performed such that a delay between a start time of the particular test stimulus pattern and a sample time of the voltage level of the power supply node is varied for each application. ADC circuit 240 is set for the normal operating mode during this repeating of the particular test stimulus pattern, and is configured to sample power supply node 120 in response to an assertion of ADC trigger signal 238. In some embodiments, for each iteration of the particular test stimulus pattern, ADC trigger signal 238 may be delayed by a different amount of time from the start of the particular test stimulus pattern. In other embodiments, the start of the test stimulus pattern may be adjusted in relation to a periodic assertion of ADC trigger signal 238. By varying a delay between the start of the particular test stimulus pattern and an assertion of ADC trigger signal 238, a plurality of voltage level samples of power supply node 120 are collected and may be compared in order to identify an occurrence of a particular criteria of the samples occurring during a particular portion of the particular test stimulus pattern. Any suitable criteria may be used, for example, a lowest or a highest voltage level sample, or a largest voltage level delta is observed from one sample to a next. The method ends in block 510.

Figure 6:
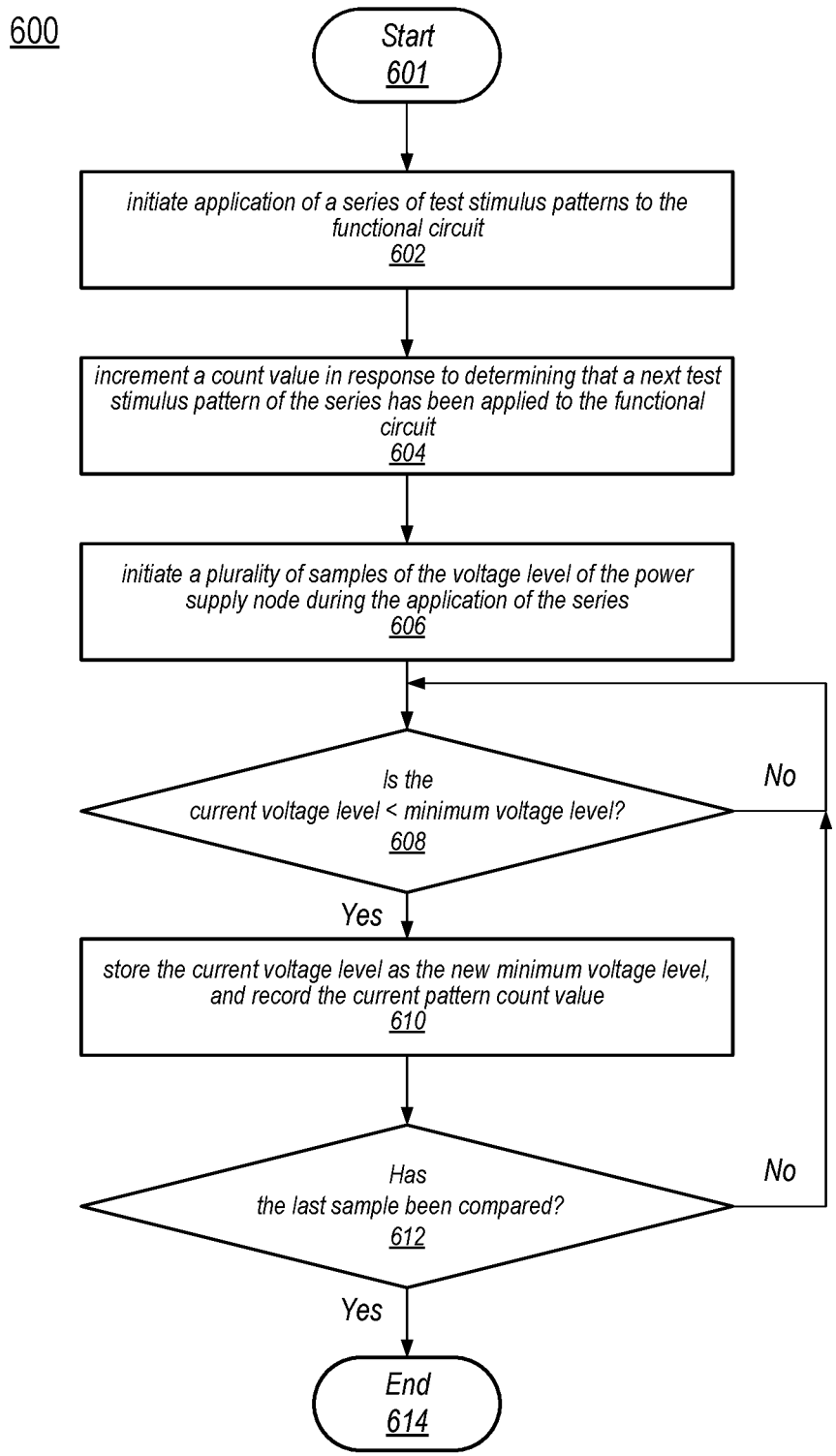
FIG. 6 shows a flow diagram of an embodiment of a method for identifying a particular test stimulus pattern.

Proceeding now to FIG. 6, another flow diagram is illustrated. Method 600 is an embodiment of a method for identifying a particular one of a plurality of test stimulus patterns by a test system. In some embodiments, method 600 may correspond to operations performed in blocks 502 and 504 of method 500 in FIG. 5. Like method 500, method 600 may be applied to circuits in test system 100 in FIGS. 1 and 2. Referring collectively to test system 100 and test circuit 110, and the flow diagram in FIG. 6, method 600 begins in block 601.

A test circuit initiates application of a series of test stimulus patterns to a functional circuit (block 602). As illustrated, test circuit 110 causes tester 150 to begin application of test stimulus patterns 155 to functional circuit 101. In some embodiments, tester 150 may apply a subset of test stimulus patterns 155. For example, test stimulus patterns 155 may include functional, BIST, and scan test stimulus patterns. For a first application of method 600, only the functional test stimulus patterns may be used. BIST test stimulus patterns may be used in a second application of method 600, and scan test stimulus patterns may be used in a third application. In another example, a subset of test stimulus patterns 155 that stimulate a particular sub-circuit or feature of functional circuit 101 may be used in a particular application of method 600.

The test circuit increments a count value in response to determining that a next test stimulus pattern of the series has been applied to the functional circuit (block 604). As shown, test circuit 110 may initialize the count value before a first pattern of test stimulus patterns 155 is applied to functional circuit 101. Test circuit 110 increments the count value in response to a start to each of the applied test stimulus patterns 155. For example, referring to chart 300 of FIG. 3, the count value may be initialized to zero at time t0 and then incremented at each of times t1, t3, t4, t6, and t7. In other embodiments, the initial value may be non-zero and test circuit 110 may decrement the count value in response to the start of each of test stimulus patterns 155.

The test circuit initiates a plurality of samples of the voltage level of the power supply node during the application of the series (block 606). Test circuit 110, as shown, may set ADC circuit 240 to operate in a level detect mode during the application of the series of test stimulus patterns 155. Referring again to FIG. 3, operating in the level detect mode may cause ADC circuit 240 to receive a stream of assertions on ADC trigger signal 238. ADC circuit 240 samples power supply node 120 in response to each of the assertions.

Further operations of method 600 may depend on values of a current voltage level sample and a stored minimum value for previous voltage level samples (block 608). As previously described, in the level detect mode ADC circuit 240 may not perform a full conversion of each sample, instead comparing two or more active samples at a time to select the active sample that meets a particular criteria. The particular criteria may include which sample has a higher, or lower, voltage level, or which sample is closer to, or farther from, a particular reference voltage level. The selected sample that meets the criteria is maintained while a new sample may replace the samples that weren't selected. In the illustrated embodiment, the sample with the lowest voltage level is selected. If a value of a previously selected sample is less than a value of a new sample, then the method remains in block 608 to compare a next sample to the selected sample. Otherwise, the method moves to block 610 to store a value of a newly selected sample.

The test circuit stores a current one of the sampled values of the voltage level of the power supply node and records a current value of the count value (block 610). When a new value for the minimum voltage level of the power supply node is sampled, test circuit 110 stores the new value in one of registers 211. In addition, test circuit 110 may store a current value of the count value that corresponds to an identity of the one of test stimulus patterns 155 that was active when the new value was sampled. In some embodiments, a value for the minimum voltage level may be stored for each of test stimulus patterns 155 that is applied during method 600. In other embodiments, a same register may be used to store the value for the minimum voltage level throughout the application of all applied test stimulus patterns 155, such that the value stored in the register is only updated if a sample in a subsequent one of test stimulus patterns 155 is less than a current value in the register.

Further operations of the method may depend on a number of samples taken (block 612). If no more samples are left to be compared and all of test stimulus patterns 155 have been applied, then the method ends in block 614. Otherwise, method 600 returns to block 608 to compare a next sample to the selected sample.

Figure 7:
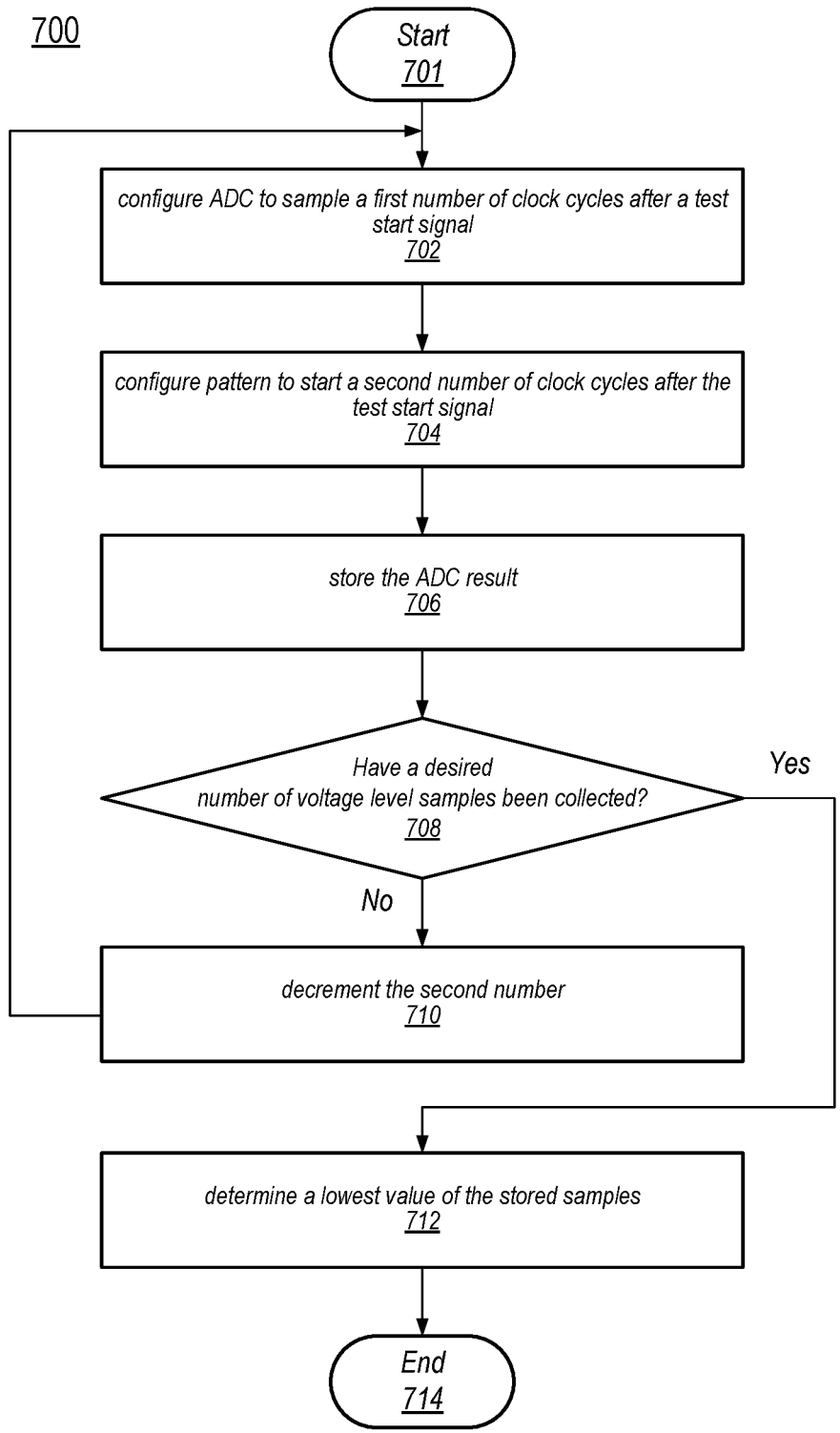
FIG. 7 depicts a flow diagram of an embodiment of a method for identifying a particular portion of a repeated test stimulus pattern.

Method 600 describes operations that may be performed in blocks 502 and 504 of method 500 in FIG. 5. Moving now to FIG. 7, a flow diagram for an embodiment of a method for identifying a portion of a test stimulus pattern is shown. Method 700 may correspond to operations performed in block 506 of method 500. Like methods 500 and 600, method 700 may be applied to circuits in test system 100 in FIGS. 1 and 2. Referring collectively to test system 100 and test circuit 110, and the flow diagram in FIG. 7, the method begins in block 701 with a particular test stimulus pattern having been identified using, for example, method 600.

A test circuit configures an ADC circuit to sample a first number of clock cycles after a test start signal (block 702). As illustrated, test circuit 110 sets ADC circuit 240 for a normal operating mode in which ADC circuit 240 generates a digital value representing the voltage level of power supply node 120 in response to an assertion of ADC trigger signal 238. Control circuit 218 sets inputs to MUX 234 to select ADC trigger counter 230 as a source for ADC trigger signal 238. Control circuit 218 also stores a value in ADC trigger counter 230 that establishes a number of cycles of clock source 216 before ADC trigger counter 230 asserts ADC trigger signal 238. The stored value provides a sufficient delay between an assertion of test start signal 222 and a corresponding assertion of ADC trigger signal 238. This value for ADC trigger counter 230 may remain consistent for the duration of method 700.

The test circuit configures a test stimulus pattern to start a second number of clock cycles after the test start signal (block 704). As shown, control circuit 218 stores a value in pattern start counter 228 that establishes a number of cycles of clock source 216 before pattern start counter 228 asserts pattern start signal 116. The relative values stored in pattern start counter 228 and ADC trigger counter 230 may determine during which portion of the identified test stimulus pattern that ADC circuit 240 samples a voltage level of power supply node 120.

The test circuit stores the ADC result (block 706). Based on the values stored in pattern start counter 228 and ADC trigger counter 230, ADC circuit 240 samples the voltage level of power supply node 120 and stores this voltage level sample in ADC result register 242. Control circuit 218 may cause the value in ADC result register 242 to be read by test result circuit 247, which in turn, stores the voltage level sample in registers 211, for example, in one of power supply voltage level registers 112. In some embodiments, test result circuit 247 may also track a point in time when pattern start signal 116 is asserted and store this value with the voltage level sample, e.g., in a corresponding one of test stimulus pattern ID registers 114. In other embodiments, the point in time is not saved, and instead a point in time when a particular voltage level sample is taken may be determined by where in a series of voltage level samples the particular voltage level sample occurs.

Further operations of the method may depend on a number of voltage level samples that have been collected (block 708). Test circuit 110 determines a number of samples to be taken during the repeated applications of the identified test stimulus pattern. The number of samples to be taken may be based on a length of the identified test stimulus pattern and a desired resolution for the samples. For example, if the identified test stimulus pattern is 5000 cycles long and it is desired to obtain one voltage level sample for every ten cycles, then 500 samples may be taken. As shown, one voltage level sample is taken for each reapplication of the identified test stimulus pattern, which may result in the identified test stimulus pattern being repeated 500 times. In other embodiments, two or more voltage level samples may be taken in a single application of the identified test stimulus pattern. If the number of samples has not been reached, then the method moves to block 710 to prepare for a subsequent reapplication of the identified test stimulus pattern. Otherwise, the method moves to block 712 to determine a lowest value of the collected samples.

The test circuit decrements the second number (block 710). As illustrated, control circuit 218 decrements the value stored in pattern start counter 228 to prepare for a subsequent reapplication of the identified test stimulus pattern. This smaller count value causes the identified test stimulus pattern to be started after a shorter delay from the assertion of test start signal 222, in relation to the previous application of the pattern. The value in ADC trigger counter 230 remains consistent for each application of the identified test stimulus pattern, resulting in ADC circuit 240 sampling power supply node 120 at a same point in time relative to assertions of test start signal 222. Accordingly, the sample of power supply node 120 occurs at a later portion of the identified test stimulus pattern for each subsequent reapplication. The method returns to block 702 to reapply the identified test stimulus pattern and take a corresponding sample of power supply node 120.

The test circuit determines a lowest value of the stored samples (block 712). If the number of samples has been reached in block 708, then test circuit 110 determines a lowest value of the collected voltage level samples that are stored in registers 211. In some embodiments, tester 150 may cause test circuit 110 to send the collected voltage level samples to tester 150, while in other embodiments, test circuit 110 may identify a sample with the lowest value and send this value along with an indication of a portion of the identified test stimulus pattern that corresponds to the identified sample. The method ends in block 714.

It is noted that methods 600 and 700 describe operations that identify lowest values of voltage level samples of a power supply node. In other embodiments, other criteria may be used to identify particular voltage level samples, such as a highest value, or a largest or smallest difference in values between samples.

Figure 8:
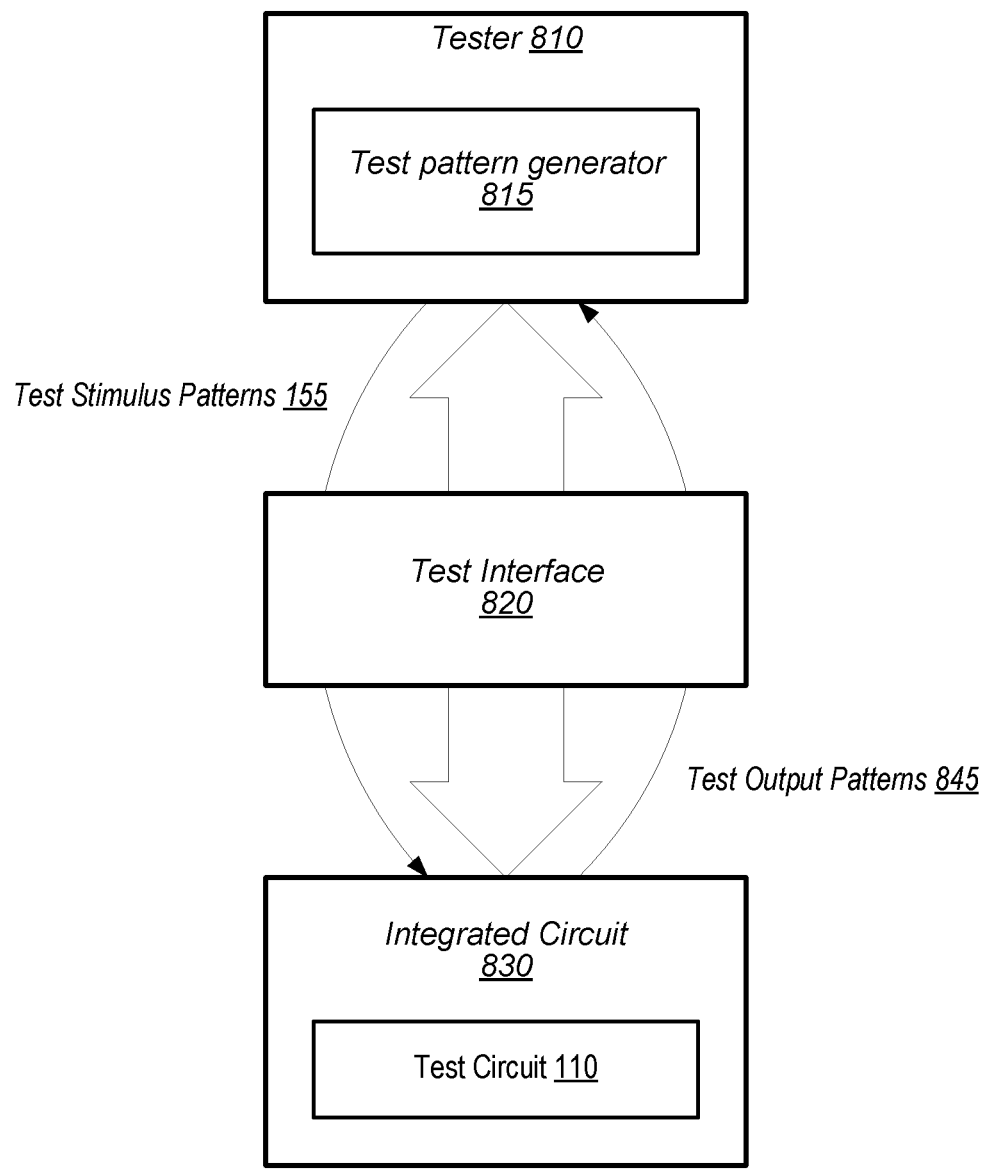
FIG. 8 shows another block diagram of an embodiment of a test system.

Proceeding now to FIG. 8, a block diagram for an embodiment of a test system is depicted. Test system 800 may, in some embodiments, correspond to test system 100 in FIG. 1. Test system 800 includes tester 810 which may be used to perform a variety of tests operations on integrated circuit 830, via test interface 820. Tester 810 includes test pattern generator 815, and, as illustrated, integrated circuit 830 includes at least one instantiation of test circuit 110.

Tester 810, as shown, includes hardware and software that may be used to perform test operations on integrated circuit 830. In some embodiments, tester 810 may be a collection of electronic equipment such as power supplies, clock generators, logic analyzers, pattern generators, and other such equipment that may be used in a laboratory environment to perform evaluations, characterizations, and/or circuit validation tests on integrated circuit 830. In other embodiments, tester 810 may correspond to automated test equipment (ATE) used to test a plurality of fabricated integrated circuits 830 in a manufacturing environment before the integrated circuits 830 are sold to a customer or assembled into other products.

Test pattern generator 815 includes hardware and software for generating test stimulus to be applied to integrated circuit 830. In some embodiments, test pattern generator 815 may include memory for storing test stimulus patterns 155. Based on test stimulus patterns 155, test pattern generator 815 generates one or more signals with particular voltage levels to be applied to integrated circuit 830. Test interface 820 includes hardware for electronically coupling tester 810 to integrated circuit 830. For example, test interface 820 may include a first physical interface used to attach to tester 810 as well as a second physical interface used to connect to a particular chip package for integrated circuit 830. Test interface 820 may further include one or more components for reducing electronic interference or otherwise improving a quality of the one or more signals generated by tester 810.

Test stimulus patterns 155 may cause integrated circuit 830 to enter a particular mode used for testing or evaluating a functionality of integrated circuit 830. For example, the one or more signals may cause test circuit 110 to activate and perform any particular combination of operations described above in regards to FIGS. 1-7. In response to test stimulus patterns 155 received from tester 810, integrated circuit 830 may generate test output patterns 845. Test output patterns 845 include one or more signals that are sent, via test interface 820, to tester 810. In various embodiments, test output patterns 845 may be used to make a pass/fail judgement of integrated circuit 830, to determine a particular level of performance achievable by integrated circuit 830, or to retrieve other operational information from integrated circuit 830.

It is also noted that, to improve clarity and to aid in demonstrating the disclosed concepts, the block diagram of test system 800 illustrated in FIG. 8 has been simplified. In other embodiments, different and/or additional circuit blocks and different configurations of the circuit blocks are possible and contemplated.

Figure 9:
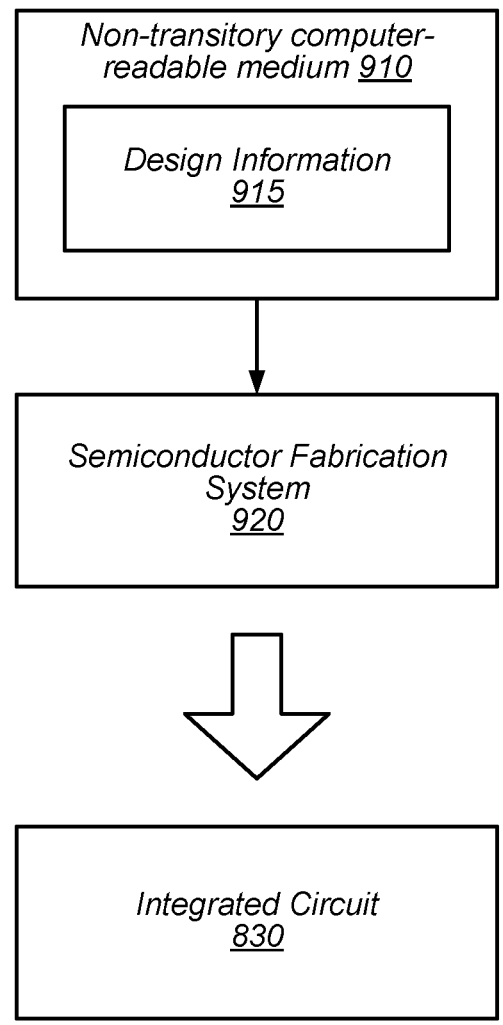
FIG. 9 illustrates a block diagram depicting an example computer-readable medium, according to some embodiments.

FIG. 9 is a block diagram illustrating an example of a non-transitory computer-readable storage medium that stores circuit design information, according to some embodiments. The embodiment of FIG. 9 may be utilized in a process to design and manufacture integrated circuits, such as integrated circuit 830 of FIG. 8. In the illustrated embodiment, semiconductor fabrication system 920 is configured to process the design information 915 stored on non-transitory computer-readable storage medium 910 and fabricate integrated circuit 830 based on the design information 915.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 830. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 830 may also be included in design information 915. Such cell libraries may include information indicative of device or transistor level netlists, mask design data, characterization data, and the like, of cells included in the cell library.

As illustrated, integrated circuit 830 may include test circuit 110 as well as functional circuit 101 shown in FIG. 1. In some embodiments, integrated circuit 830 may include a plurality of functional circuits as well as a plurality of test circuits for use in testing the plurality of functional circuits. Integrated circuit 830 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 830 is configured to operate according to a circuit design specified by design information 915, which may include performing any of the functionality described herein. For example, integrated circuit 830 may include any of various elements shown or described herein. Further, integrated circuit 830 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a functional circuit including a power supply node, the functional circuit configured to operate in a test mode that includes generating respective test output patterns in response to application of a plurality of test stimulus patterns;
a test circuit configured to:
identify a particular test stimulus pattern of the plurality of test stimulus patterns; and
reapply the particular test stimulus pattern to the functional circuit multiple times, varying, for each reapplication, a start time of the particular test stimulus pattern in relation to when a voltage level of the power supply node is sampled for that reapplication.

2. The apparatus of claim 1, wherein the test circuit is further configured to reapply the particular test stimulus pattern by:
  asserting a pattern start signal to start a reapplication of the particular test stimulus pattern; and
  asserting a sample start signal to initiate a sample of a voltage level of the power supply node; and
  wherein the test circuit is further configured, for each successive reapplication of the particular test stimulus pattern, to vary the start time by decreasing an amount of time before asserting the pattern start signal for each reapplication of the particular test stimulus pattern.

3. The apparatus of claim 1, wherein the test circuit is further configured to:
  store a plurality of samples of the voltage level of the power supply node; and
  identify, using the plurality of samples, a particular portion of the particular test stimulus pattern based on one of the plurality of samples that exhibits a particular characteristic.

4. The apparatus of claim 3, wherein the particular characteristic is a lowest voltage level within the plurality of samples.

5. The apparatus of claim 1, wherein the test circuit includes an analog-to-digital converter (ADC) circuit that is configured to, during a particular mode of operation, identify a minimum voltage level of the power supply node at a particular sampling rate; and
  wherein to identify the particular one of the plurality of test stimulus patterns, the test circuit is further configured to enable the particular mode of the ADC circuit to select one of the plurality of test stimulus patterns that corresponds to a minimum voltage level on the power supply node.

6. The apparatus of claim 5, wherein the ADC circuit is further configured to, during a different mode of operation, determine a digital value representing the voltage level of the power supply node at a different sampling rate that is slower than the particular sampling rate; and
  wherein to sample the voltage level of the power supply node during reapplication of the particular test stimulus pattern, the test circuit is further configured to use the different mode of the ADC circuit.

7. The apparatus of claim 1, wherein the test circuit includes a minimum voltage register and a pattern index register, and wherein the test circuit is further configured to store a value indicating a current test stimulus pattern being applied into the pattern index register in response to a value being stored into the minimum voltage register.

8. A method, comprising:
  sampling, by a test circuit, a voltage level of a power supply node of a functional circuit during application of a series of test stimulus patterns to the functional circuit;
  identifying, by the test circuit, a particular test stimulus pattern of the series of test stimulus patterns; and
  repeating, by the test circuit, application of the particular test stimulus pattern to the functional circuit, wherein the repeating is performed such that a delay between a start time of the particular test stimulus pattern and a sample time of the voltage level of the power supply node is varied for each application.

9. The method of claim 8, wherein varying the delay for each application of the particular test stimulus pattern includes, before each application, shifting a start time of the particular test stimulus pattern relative to the sample time.

10. The method of claim 8, wherein identifying the particular test stimulus pattern comprises:
  incrementing a count value in response to determining that a next test stimulus pattern of the series has been applied to the functional circuit; and
  recording the count value when a new value for a minimum voltage level of the power supply node is sampled.

11. The method of claim 8, further comprising, during the repeating of the application of the particular test stimulus pattern, identifying a particular portion of the particular test stimulus pattern that corresponds to a particular value of the voltage level of the power supply node.

12. The method of claim 11, wherein identifying the particular portion of the particular test stimulus pattern includes:
  storing a plurality of sampled values of the voltage level of the power supply node;
  determining a lowest value of the stored plurality of sampled values; and
  identifying the particular portion based on the delay used between the start time of the particular test stimulus pattern and a corresponding sample time associated with the lowest value.

13. The method of claim 11, further comprising sending an indication of the particular test stimulus pattern and the particular portion of the particular test stimulus pattern to a user of the test circuit.

14. The method of claim 8, wherein the series of test stimulus patterns includes at least one scan mode test stimulus pattern.

15. An apparatus, comprising:
  an analog-to-digital converter (ADC) circuit configured to sample a voltage level of a power supply node of a functional circuit; and
  a test controller circuit configured to:
    initiate application of a series of test stimulus patterns to the functional circuit;
    initiate a plurality of samples of the voltage level of the power supply node during the application of the series;
    identify a particular test stimulus pattern of the series;
    initiate repeat applications of the particular test stimulus pattern to the functional circuit; and
    for each application, sample a voltage level of the power supply node at a different point in time relative to a beginning of the particular test stimulus pattern.

16. The apparatus of claim 15, wherein to identify the particular test stimulus pattern of the series, the test controller circuit is further configured to record which test stimulus pattern of the series is active when a lowest voltage level is sampled by the ADC circuit.

17. The apparatus of claim 16, wherein to record a corresponding test stimulus pattern that is active when a lowest voltage level is sampled by the ADC circuit, the test controller circuit is further configured to store a value identifying the corresponding test stimulus pattern into a pattern index register in response to the ADC circuit detecting a new lowest voltage level.

18. The apparatus of claim 16, wherein the ADC circuit is further configured to
  during a first mode of operation, determine a digital value representing the voltage level of the power supply node at a first sampling rate; and during a second mode of operation, identify a minimum voltage level of the power supply node at a second sampling rate that is faster than the first sampling rate; and wherein the test controller circuit is further configured to use the ADC circuit in the second mode during application of each of the series of test stimulus patterns.

19. The apparatus of claim 15, wherein to sample the voltage level of the power supply node at the different point in time, the test controller circuit is further configured to:
  configure the ADC circuit to sample the voltage level of the power supply node at a regular interval; and
  initiate each successive application of the of the particular test stimulus pattern at an earlier time relative to the regular interval.

20. The apparatus of claim 15, wherein the test controller circuit is further configured to identify a particular portion of the particular test stimulus pattern based on values of the voltage level of the power supply node sampled during the repeated applications of the particular test stimulus pattern.

* * * * *